(12) United States Patent
Wu

(10) Patent No.: US 7,064,408 B2
(45) Date of Patent: Jun. 20, 2006

(54) SCHOTTKY BARRIER DIODE AND METHOD OF MAKING THE SAME

(75) Inventor: Shye-Lin Wu, No. 10, Alley 53, Lane 454, Chen Kung Road, Hu Kuo Hsiang, Hsinchu Hsien (TW)

(73) Assignees: Shye-Lin Wu, Hsinchu Hsien (TW); Chip Integration Tech Co., Ltd., Hsin-Chu (TW)

(*) Notice: Subject to any disclaimer, the term of this patent is extended or adjusted under 35 U.S.C. 154(b) by 41 days.

(21) Appl. No.: 10/731,503

(22) Filed: Dec. 10, 2003

(65) Prior Publication Data
US 2005/0127464 A1    Jun. 16, 2005

(51) Int. Cl.
*H01L 29/872* (2006.01)

(52) U.S. Cl. .................. 257/484; 257/471; 257/473; 257/475; 438/575; 438/576; 438/534

(58) Field of Classification Search ............... 257/471, 257/473, 475, 483, 484, 485; 438/534, 575, 438/576
See application file for complete search history.

(56) References Cited

U.S. PATENT DOCUMENTS

| | | | | |
|---|---|---|---|---|
| 5,241,195 A | * | 8/1993 | Tu et al. ................ | 257/155 |
| 5,262,669 A | * | 11/1993 | Wakatabe et al. ........... | 257/483 |
| 6,218,688 B1 | * | 4/2001 | Kalnitsky et al. ........... | 257/280 |
| 6,309,929 B1 | * | 10/2001 | Hsu et al. .................... | 438/270 |
| 6,399,996 B1 | * | 6/2002 | Chang et al. ............... | 257/484 |
| 6,404,033 B1 | * | 6/2002 | Chang et al. ............... | 257/484 |
| 6,426,541 B1 | * | 7/2002 | Chang et al. ............... | 257/472 |
| 6,740,951 B1 | * | 5/2004 | Tsui et al. .................. | 257/483 |
| 2005/0029614 A1 | * | 2/2005 | Wu ............................. | 257/471 |

* cited by examiner

*Primary Examiner*—Bradley K. Smith
*Assistant Examiner*—Steven J. Fulk
(74) *Attorney, Agent, or Firm*—Troxell Law Office, PLLC

(57) ABSTRACT

A power Schottky rectifier device having pluralities of trenches are disclosed. The Schottky barrier rectifier device includes field oxide region having p-doped region formed thereunder to avoid premature of breakdown voltage and having a plurality of trenches formed in between field oxide regions to increase the anode area thereto increase forward current capacity or to shrinkage the planar area for driving the same current capacity. Furthermore, the trenches have rounded corners to alleviate current leakage and LOCOS region in the active region to relief stress during the bonding process. The processes for power Schottky barrier rectifier device including termination region formation need only three masks and thus can gain the benefits of cost down.

4 Claims, 5 Drawing Sheets

SCHOTTKY BARRIER DIODE AND METHOD OF MAKING THE SAME

FIELD OF THE INVENTION

The present invention relates to a semiconductor process, specifically, to a Schottky barrier power rectifier having buried p+ layers under LOCOS structure to reduce reverse leakage current and improve breakdown voltage, and pluralities of trenches in between them to increase the active area resulting in higher forward current capacity.

BACKGROUND OF THE INVENTION

Schottky diode is an important power device and used extensively as output rectifiers in switching-mode power supplies and in other high-speed power switching applications, such as motor drives, switching of communication device, industry automation and electronic automation and so on. The power devices are usually required characteristics of carrying large forward current, high reverse-biased blocking voltage, such as above 100 volt, and minimizing the reverse-biased leakage current.

A number of power rectifiers have been used to provide high current and reverse blocking characteristics. An exemplary method to form a Schottky barrier diode is disclosed by Chang et al in U.S. Pat. No. 6,404,033. The processes are shown in FIG. 1A to FIG. 1C. Referring to FIG. 1A, a semiconductor substrate having an n+ doped layer 10 and an n–drift layer 12 extended to a first surface 13 is prepared. A field oxide layer 14 is then formed on the first surface 13. Afterward, the field oxide layer 14 is patterned to define positions of guard ring 22 at the termination region. Guard ring regions 22 are then buried into n–drift layer 12 by double implants with $B^+$ and $BF_2^+$ as conductive impurities. Thereafter, a thermal anneal process is then performed to drive in and activate the impurities. Thereafter, a second photoresist pattern 24 is then coated on the resultant surface to define an anode region. The results are shown in FIG. 1B.

Referring to FIG. 1C, a wet etch is then performed to remove those exposed field oxide layer 14. After stripping away the photoresist pattern 24, another photoresist pattern 28 having openings is formed on the resultant surface to define trenches at the active region. An etching step is then performed to recess the drift layer 12 using the photoresist pattern 28 as a mask. Another $B^+$ or $BF_2^+$ ion implant is then carried out to form p type region 30 buried into trench bottom.

Referring to FIG. 1D, the photoresist pattern 28 is removed. Then, a Schottky barrier metal layer 32 is formed on the resultant surface. Thereafter, a top metal layer formation is followed. A forth photoresist (not shown) and an etch steps are then performed to define the top electrode 36. After the layers formed on the backside surface during forgoing step are removed, a metal layer 60 is then formed, which is used as a bottom electrode 34.

Although the Schottky barrier rectifier disclosed in U.S. Pat. No. 6,404,033 having pluralities of trenches to increase the surface area thereto increases forward current capacity and having buried p layers 30 at the bottom of the trenches to form p-n junction regions to increase breakdown voltage. However, it requires a complex processes at least four to six masks. And also, the buried p-n junctions will introduce many minority carriers when device is under forward bias, which will result in a larger reverse recovery time than the typical Schottky barrier rectifier. The object of the present method is to improve the breakdown voltage and enhance the forward current capacity and simplify the manufacturing processes.

SUMMARY OF THE INVENTION

A power Schottky rectifier device and method of making the same are disclosed. The Schottky rectifier device includes field oxide region having p doped region formed thereunder to avoid premature of breakdown voltage and having a plurality of trenches formed in between field oxide regions to increase the surface area so as to enhance forward current capacity. Furthermore, the corner of trench has been rounded to alleviate the reverse-biased leakage current. The present method of Schottky barrier rectifier comprises the following steps: firstly, an n+ doped substrate formed with an n–drift layer, and a pad oxide layer is provided. Subsequently, a nitride layer is formed on the pad oxide layer. The active area is then defined by using the photolithography and dry etching processes. After p-type impurities implant (e.g., boron or $BF_2^+$ ion implant), a thermal oxidation is then performed to form field oxide region in the active region and termination oxide region at the perimeter of the substrate. A second patterning process is then implemented to form a plurality of trenches in between each oxide regions. Thereafter, another thermal oxidation process is carried out to recover etching damages and round the corners in each trench. After removing the oxide layer, a metallization process is performed to form metal (or silicide) layer on the surfaces of the trenches and the mesas. Next, a top metal layer is formed on the front surface of the substrate. The top metal layer is then patterned to defined anode electrode. Then, the backside metallization is formed to serve as cathode electrode.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1A:
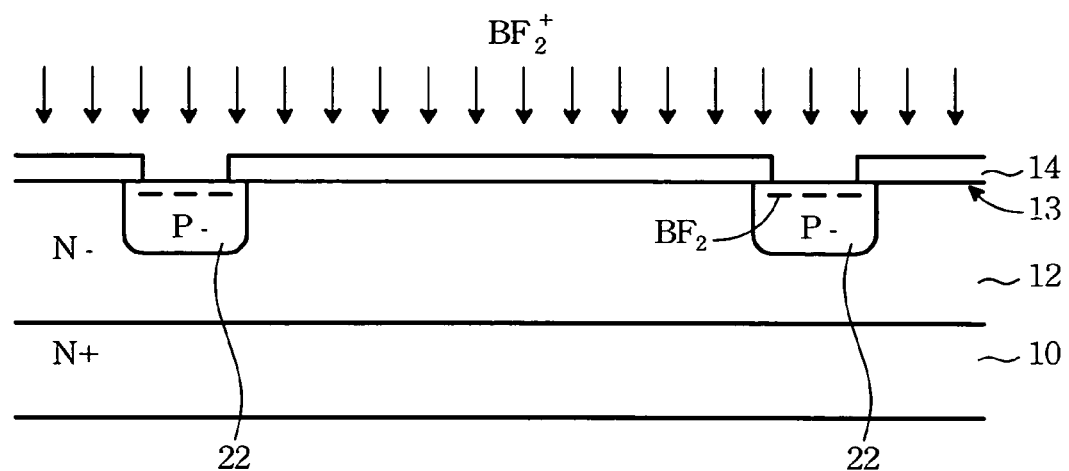
FIGS. 1A to 1D show steps of forming a conventional Schottky barrier diode with a plurality of trenches and p-region at the bottom of each trench and p+ guard ring structure at the termination in accordance with prior art.
Figure 1B:
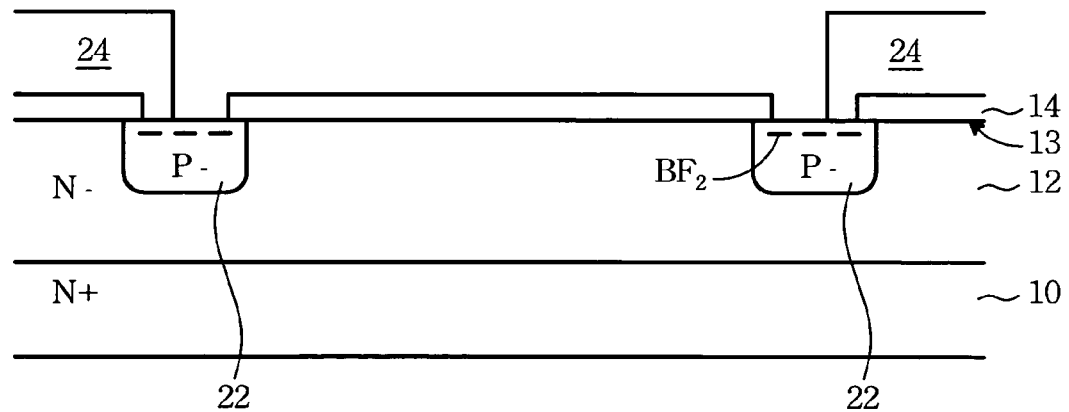
Figure 1C:
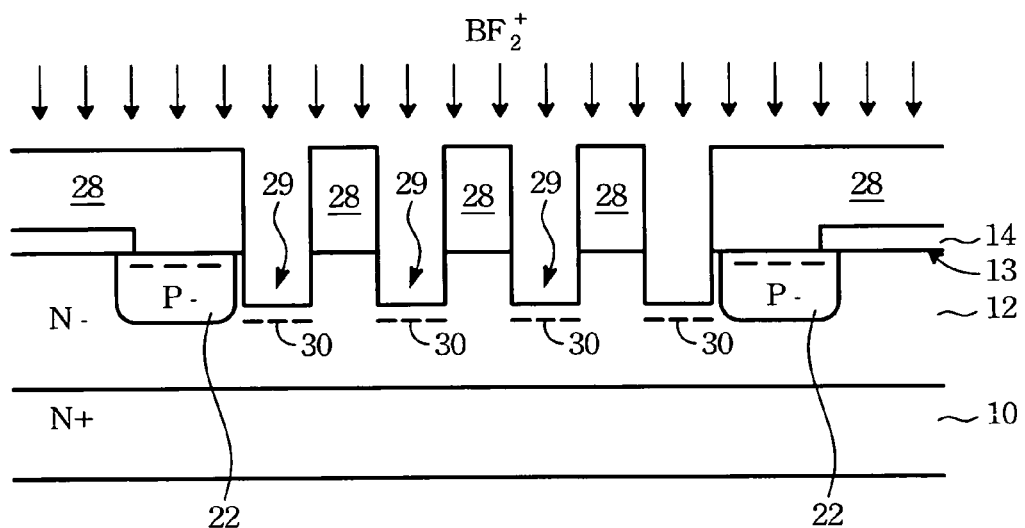
Figure 1D:
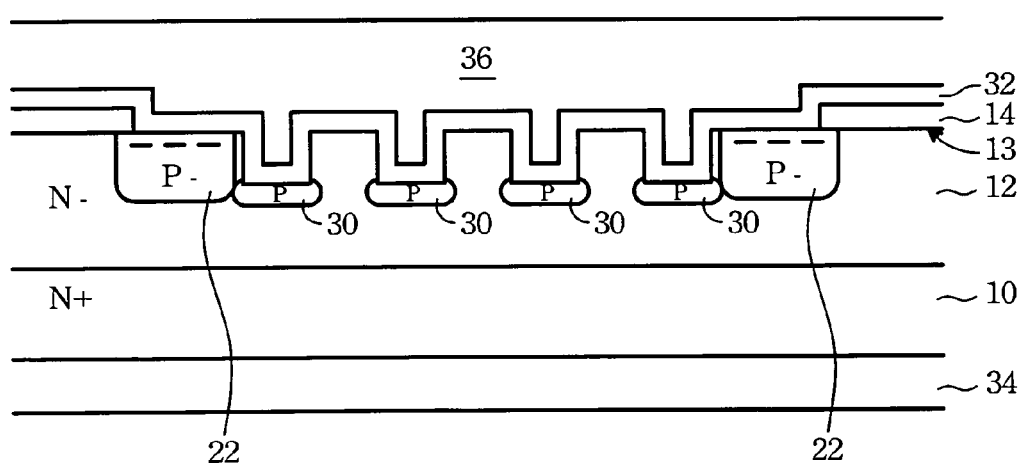
Figure 2:
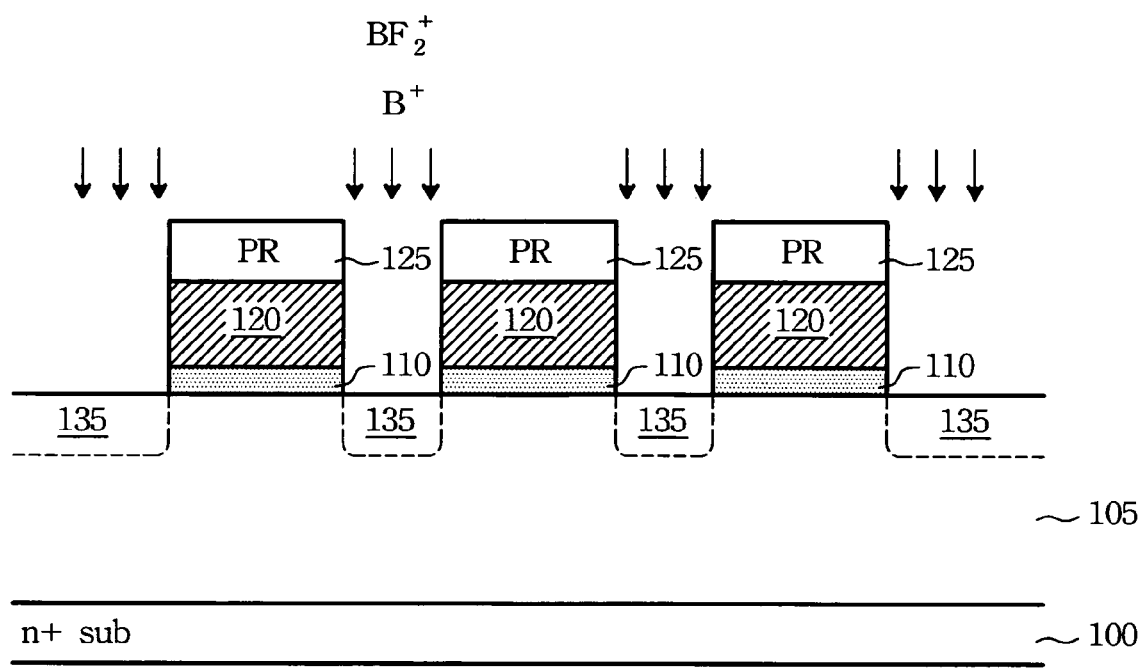
FIG. 2 is a cross-sectional view of forming nitride mask pattern layer on the oxide layer and forming p-type impurities implant region into n– epi layer in accordance with the present invention.

As depicted in the forgoing background of the invention, to form a power rectifier device and its termination structure using the conventional technique requires at least four to six photo masks. The present invention can simplify the processes by using only three photo masks. The detailed descriptions are as follows:

Firstly, an n+ doped substrate 100 formed with an n–drift layer 105, and a pad oxide layer 110 is provided. To define active region, referring to FIG. 2, a nitride layer 120 is formed on the oxide layer 110. A photoresist pattern 125 coated on the nitride layer 120 to define active region is then followed. Subsequently, an etching back step is performed to etch the nitride layer 120 and the oxide layer 110 by using the photoresist pattern 125 as a mask.

After active region definition, a p-type impurity implantation process, for example, implants $B^+$ and $BF_2^+$ ions into the n– epi layer 105 to form a p region 135 is then successively performed. The dosage and the implant energy are about $5 \times 10^{10}$–$5 \times 10^{14}/cm^2$ and 10–1000 keV for boron ions and about $5 \times 10^{11}$–$5 \times 10^{15}/cm^2$ and 30–300 keV for $BF_2^+$ ions.

Figure 3:
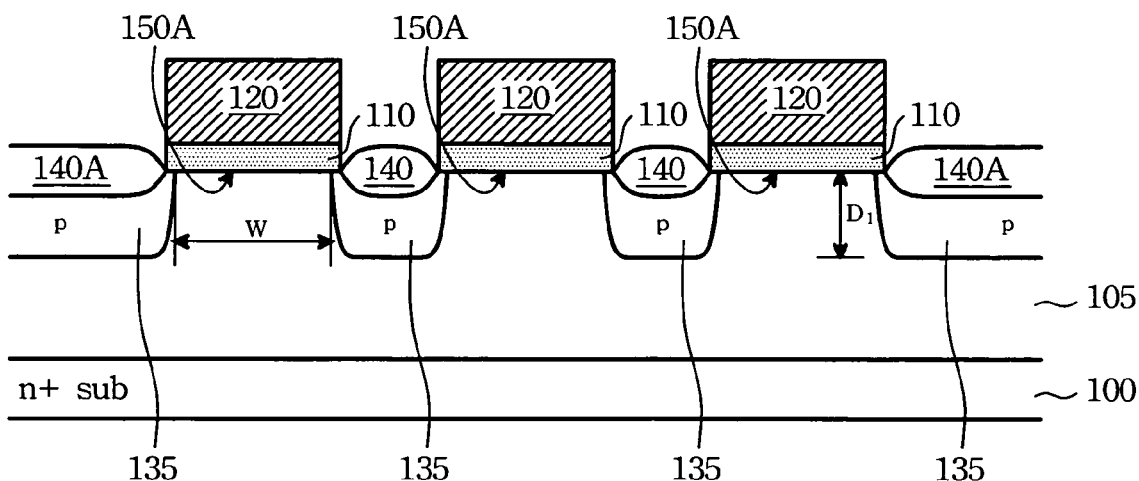
FIG. 3 is a cross-sectional view of performing thermal oxidation to form field oxide regions, and termination region, as well as to extend the p layer region in accordance with the present invention.

After ion implantation, the photoresist pattern 125 is stripped away and a thermal oxidation process is followed by using the nitride layer 120 as a mask, as is shown in FIG. 3. During the thermal oxidation process, a pair of thick field oxide regions 140 buried into the active region of the substrate and thick oxide termination regions 140A buried into the perimeter of the substrate are grown by using the nitride layer 120 as a mask. In addition, the ions in the p regions 135, are driven in both laterally and longitudinally into n– epi layer 105 and results in extending the regions thereof.

In a preferred embodiment, the width W of the mesa region 150A in between two field oxide regions 140 and in between the field oxide region 140 and termination is between about 10–1000 μm for field oxide region having 0.3–2 μm in thickness and the p/n junction 135/105 having a depth D1 of about 0.3–3 μm from the surface of the mesa region 150A.

Figure 4:
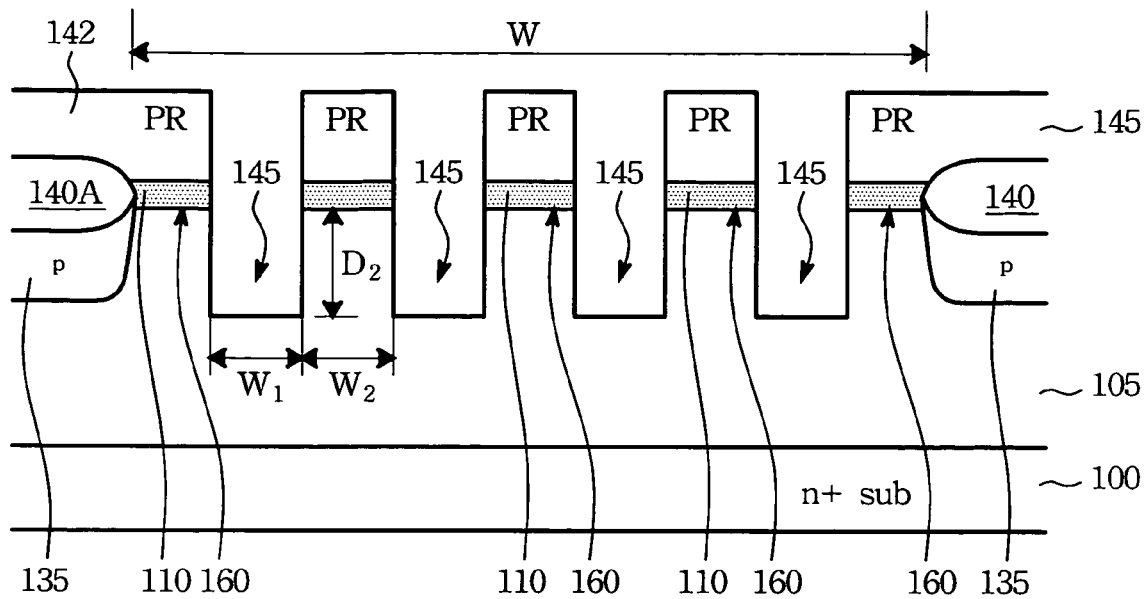
FIG. 4 is a cross-sectional view of forming a plurality of trenches in between of field oxide regions and in between field oxide region and termination region

Referring to FIG. 4, the nitride layer 120 is removed firstly. A photoresist pattern 142 formation is then followed to define a plurality of trenches. Subsequently, an etching process is performed to recess the n– epi layer 105. Preferably, each resulted trench 145 has a width W1 and depth D2 of about 0.5 to 5 μm and 0.1 to 5 μm, respectively. The sub-mesa 160 width W2 in between two trenches 145 is about 0.5 to 5 μm.

Figure 5:
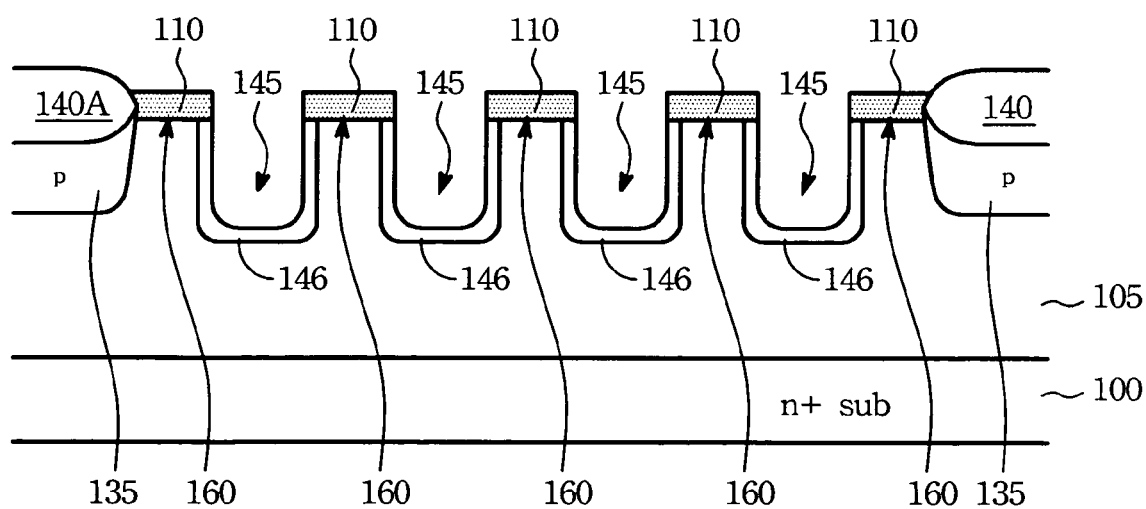
FIG. 5 is a cross-sectional view of forming thermal oxide layer to round the trench corners.

Thereafter, the photoresist pattern 142 is stripped away, and a thermal oxidation process forming an oxide layer 146 is then performed. The oxidation process is performed to recover etching damages and make the trench corner rounding so as to alleviate the problem of current leakage. The resulted structure is shown in FIG. 5.

Figure 6:
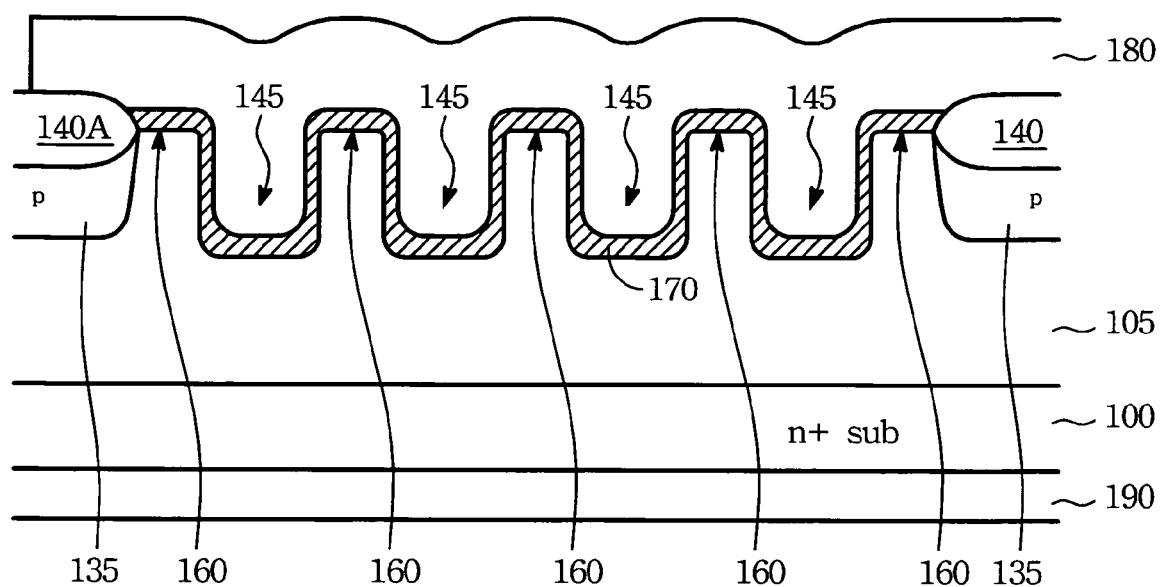
FIG. 6 is a cross-sectional view of forming metal (or silicide) on the surfaces of trenches and mesas and forming a patterned anode electrode on the front surface and a cathode electrode on the back side surface of the substrate.

Please refer to FIG. 6, a wet etch is followed to remove the oxide layer 146. Afterward, a barrier metal layer deposited on the front surface is then followed. The material of the barrier metal, for example, Al, AlCu, AlSiCu, Ti, Ni, Cr, Mo, Pt, Zr, W etc., can be acted as candidates. After a metallization process to form a Schottky barrier layer 170 on the mesa region 160 and all of the sidewalls and bottoms of trenches 145. The unreacted metal layer on both field oxide region 140 and termination region 140A is then removed by a wet etch. Afterward, a top metal layer 180 is deposited on the Schottky barrier layer 170 and covered the field oxide regions 140 and the termination region 140A. The material of the top metal layer 180 is chosen, for example, Al, AlCu, AlSiCu, Ti/Ni/Ag etc. Subsequently, the top metal layer 180 is patterned to serve as anode which includes extension portions of the top metal layer 180 on the termination regions 140A. A backside metal layer 190 is formed as a cathode electrode.

Figure 7:
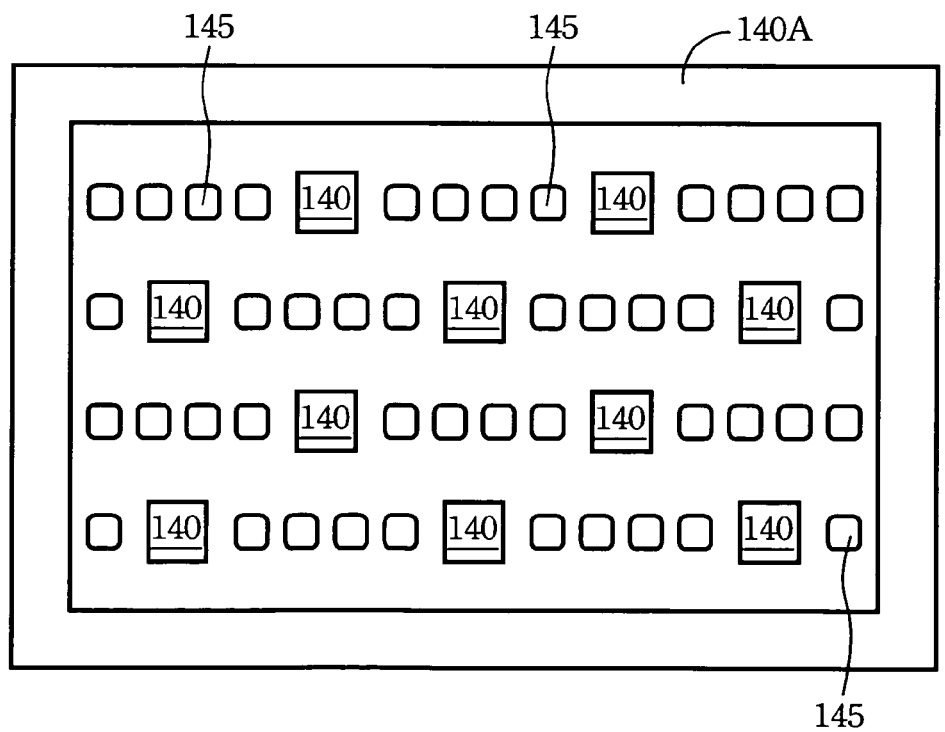
FIG. 7 is a synoptic layout showing a plurality of trenches distributed in the spacing of field oxide regions at the active area and the termination region.

FIG. 7 shows a synoptic layout of the devices in accordance with the present invention.

The Benefits of this Invention are:

(1) The processes provided are much simpler than the conventional methods. The method according to the present invention demands only three photo masks: the first one is for active regions definition, the second for pluralities of trenches definition, and the three for top metal electrode definition.

(2) The field oxide regions in the active region of the substrate can serve as a buffer layer for stress relief during the bonding process. In addition, the buried p+ layer 130/135 and field oxide regions 140 can also improve the breakdown voltage.

(3) The termination field oxide regions 140A are broad and flatted and thus the bending regions of the depletion boundary are anticipated to be far away from the active region than the conventional device.

(4) The pluralities of trenches in between field oxide region can increases significantly surface area to enhance forward current capacity.

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

What is claimed is:

1. A power rectifier device, comprising:
   an n–drift layer formed on an n+ substrate;
   a cathode metal layer formed on a surface of said n+ substrate opposite said n–drift layer;
   a pair of field oxide regions formed into said n–drift layer, and said field oxide regions separated by a first mesa;
   a pair of termination regions spaced, respectively, said pair of field oxide regions with a second mesa;
   said first mesa and said second mesa having trenches formed into said n–drift layer;
   four p-type doped regions, respectively, right beneath each of said termination regions and said field oxide regions;
   a barrier metal layer formed on sidewalls and bottom of said trenches, and formed on remnant portions of said first mesa and said second mesa; and
   a top metal layer acted as an anode electrode formed on said barrier metal layer, said field oxide regions and extended to cover a portion of said termination regions.

2. The power rectifier device according to claim 1 wherein said barrier metal layer is formed from the group of Al, AlCu, AlSiCu, Ti, Ni, Cr. Mo, Pt, Zr, and W, Ti/TiN, etc.

3. The power rectifier device according to claim 1 wherein said top metal layer is formed of stack layers of Al, AlCu, AlSiCu or Ti/Ni/Ag.

4. A power rectifier device, comprising:
   an n–drift layer formed on an n+ substrate;
   a cathode metal layer formed on a surface of said n+ substrate opposite said n–drift layer;

a pair of field oxide regions formed into said n–drift layer, and said field oxide regions separated by a first mesa;

a pair of termination regions spaced apart, said pair of field oxide regions with a second mesa;

said first mesa and said second mesa having trenches formed into said n–drift layer;

four p-type doped regions, one of said termination regions and said field oxide regions are located on each of the four p-type doped regions;

a barrier metal layer formed on sidewalls and bottom of said trenches, and formed on remnant portions of said first mesa and said second mesa; and a top metal layer acted as an anode electrode formed on said barrier metal layer, said field oxide regions and extended to cover a portion of said termination regions.

* * * * *